United States Patent [19]

Miner

[11] 3,777,576

[45] Dec. 11, 1973

[54] COMPACT TV TUNER

[75] Inventor: Carroll R. Miner, Wilbraham, Mass.

[73] Assignee: General Instrument Corporation, Newark, N.J.

[22] Filed: Jan. 23, 1973

[21] Appl. No.: 326,147

[52] U.S. Cl. ................ 74/10.29, 74/10.41, 74/10.52

[51] Int. Cl. ................ H03j 1/08, H03j 1/14

[58] Field of Search ................ 74/10.29, 10.41, 74/10.52, 10.8

[56] References Cited

UNITED STATES PATENTS

| | | | |
|---|---|---|---|
| 3,307,414 | 3/1967 | Naber et al. | 74/10.41 |
| 3,599,497 | 8/1971 | Fukumitsu | 74/10.52 X |
| 3,618,405 | 11/1971 | Ishida | 74/10.52 |

*Primary Examiner*—Allan D. Herrmann
*Attorney*—Maxwell James et al.

[57] ABSTRACT

In a tuner for tuning a TV receiver or the like to a selected one of a plurality of predetermined frequencies or channels, a detent element is interposed between the main tuning shaft and the tuning element per se, planetary gearing drives the detent element from the main tuning shaft, gearing drives the control shaft of the tuning element from the detent element, the detent element carries fine tuning parts, and all of these cooperating members are securely and reliably assembled and mounted for long life and easy operation. The detent element and the gear connecting it to the control shaft of the tuning element are provided with elongated extensions which rotatably mount the respective parts, those extensions in turn being supported by a portion of the main tuning shaft. The detent element is itself recessed in order to receive certain of the driving gears, including at least part of the planetary gearing. Actuation of the fine tuning member carried by the detent element is accomplished by means of an axially extending cam mounted on a rotatable fine tuning element. Compactness of design is therefore achieved without sacrifice of sturdiness or reliability.

19 Claims, 7 Drawing Figures

COMPACT TV TUNER

The present invention relates to a tuning mechanism particularly well adapted for tuning to a selected one of a plurality of TV channels and then providing for fine tuning within the selected channel.

Tuners designed when actuated to tune a receiving set such as a television receiver to a preselected one of a plurality of stations or channels are well known and take many forms. Insofar as the present invention is concerned, the precise nature of the means employed in the communications receiver itself to effect tuning to a particular reception frequency forms no part of the present invention. What this invention is directed to is the mechanism by means of which a tuning element, whatever its character, is appropriately conditioned for precise reception of a particular station or channel. The invention is here specifically disclosed in connection with a tuner designed to effect tuning over the entire UHF band, in which there are seventy or more individual channels. To provide a device capable of coarse tuning to any selected one of the seventy or more available UHF channels with sufficient accuracy so as to be capable of distinguishing in its tuning between any two adjacent channels presents many problems, both mechanical and electrical. The public has become accustomed to step-by-step TV tuning in connection with the 13 available channels in the VHF band, and therefore expects similar tuning capability in the UHF band, but the much greater number of channels which must be tuned in the UHF band, and the very high precision of tuning which is required because of the relatively close spacing of those channels, has given rise to special new mechanical arrangements for the UHF TV tuners.

It is important to the tuner manufacturer to produce tuners of extremely small size and at an exceedingly low cost. Set manufacturers are under pressure from the consumers to produce TV receiving sets which take up as little space as possible. The TV tube itself requires an appreciable amount of space, the electrical circuitry involved in tuning also presents certain space problems, and consequently it is desired by the set manufacturers that the mechanical arrangements provided for effecting tuning from one channel to another be of minimal size. Moreover, since the sales of TV sets to the public are very competitive as to price, and since a given manufacturer produces very large numbers of receiving sets, a saving of but a few cents in cost per set, or per tuner, can represent a very appreciable amount of money when a full years sales are taken into consideration.

The requirements for small size and low cost represent only one side of the coin. The tuners must also be sturdy and reliable, since they will be operated by the owner of a TV set many hundreds of thousands of times over the life of the set for changing from one channel to another, and any failure of the mechanical tuner portion of the receiving set will be treated by the consumer, who does not know the cause of a given malfunction but is only interested in the fact that the malfunction has occurred at all, as simply a flaw in the set as a whole, thus reflecting directly upon the reputation of the set manufacturer and affecting the ability of the manufacturer to sell a set of his manufacture to that person in the future. For comparable reasons, it is essential that the mechanical tuning arrangement be able to be operated by the user with extreme ease and with simplicity of manipulation. Hence the structures involved must be sturdy and so constructed as to move readily and without binding.

Mechanical arrangements can be, and have been, devised capable of effecting step-by-step tuning from one TV channel to another, not only within the thirteen channel VHF spectrum but also within the seventy channel UHF spectrum, and these prior art constructions meet the above-set forth requirements to greater or lesser degrees. However, any design of the prior art had to represent a very significant compromise. Sturdiness can be achieved at the expense of size and weight. Low cost can be achieved at the expense of sturdiness. To achieve reliability of action with a small device is much more difficult than with a large device. Attempts to reduce size and weight may result in parts which are improperly supported or mounted and which therefore will tend to fail in use. Increased facility of operation may call for the use of greater number of parts or larger parts, than would otherwise be the case, thus adding to size and cost. Other "trade-offs" will be apparent.

It is the prime object of the present invention to devise an arrangement of mechanical parts for a tuner which will achieve the desired objectives of reliability, sturdiness, low cost, and low size and weight, to an optimum degree with respect to all of said requirements, and with a minimal amount of sacrifice with respect to any given requirement in order to achieve desired results with respect to some other requirement.

It is a more specific object of the present invention to provide a TV tuner construction in which all of the rotating parts of the tuner drive are sturdily and reliably mounted for long life and sure and easy rotation, yet in which the parts take up a minimal amount of space and are of minimal cost.

Another object of the prsent invention is to devise a TV tuner assembly the parts of which can be readily and inexpensively manufactured and assembled, and in which a replacement of defective parts is facilitated.

A further object of the present invention is to utilize in such a tuner a compact sub-assembly of the operative tuner transmission parts, insertable and replaceable as such.

In accordance with the present invention, the control shaft of the tuning element is connected to a manually operable tuning shaft through a rotary detent element which provides for the step-by-step tuning effect desired. (The term "detent" is here used in a broad sense, including both detenting mechanisms properly considered and other step-by-step mechanism such as indexing mechanisms.) The detent element is provided with an axial extension by means of which that element is rotatably journaled in the tuner. The detent element is drivingly connected to a gear which in turn causes rotation of the tuning element control shaft. That gear too is preferably provided with an axial extension which rotatably journals in the tuner assembly, and that gear, whether provided with such an extension or not, is preferably rotatably mounted on the detent element extension. It is preferred that both the detent element and the gear be supported by a portion of the tuning shaft. The previously mentioned gear may rotate the tuning element control shaft by meshing with another gear, and to minimize the size of the tuning assembly without adversely affecting its sturdiness and reliability, the tuning shaft and the detent element and gear extensions mounted thereon may be located internally of said other gear and may all pass through a slot formed in the last-mentioned gear. The operative connection between the tuning shaft and the detent element may be by means of a planetary gear system one or more of the gears of which are housed within a recess formed in the detent element itself, thereby further minimizing the size of the overall assembly. The connection between the detent element and the gear driven thereby is through a member articulately mounted on that face of the detent element facing away from the tuning element and its control shaft. A fine tuning operator, such as a shaft mounted coaxially on the first mentioned tuning shaft, causes rotation of a fine tuning element which carries an axially extending cam, that cam engaging the member articulately mounted on the detent element and causing movement of that member relative to the detent element for fine tuning purposes. The detent element is operatively connected directly or indirectly to any suitable indicating means, such as a digital counter, in order that the number of the TV channel being tuned at any moment will be made visible to the operator of the TV set.

To the accomplishment of the above, and to such other objects as may hereinafter appear, the present invention relates to the structure and arrangement of a tuning system as defined in the appended claims and as described in this specification, taken together with the accompanying drawings, in which:

The tuning element generally designated A, which may be constituted by a rotary variable condenser-tuned transmission line or the like, is provided with a control shaft generally designated B. Mounted in a manner accessible to the exterior of the tuner is a tuning shaft generally designated C designed to effect tuning of the element A from one channel to the next. The tuning shaft C is drivingly connected to the control shaft B of the tuning element A by means including a rotary detent element generally designated D, that element D carrying thereon a member generally designated E which moves with the detent element D and is also movable relative thereto, the member E being drivingly connected to a gear generally designated F which in turn is drivingly connected to the control shaft B. When the tuning shaft C is rotated the detent element D likewise rotates and, through the intermediation of the member E, causes the gear F to rotate, which in turn drives the tuning element control shaft B, effecting tuning of the set. Fine tuning is effected, without disturbing the detent position of the tuning system, by means of a fine tuning shaft generally designated G which, by suitable mechanical interconnection, causes movement of the member E relative to the detent-fixed element D, thereby producing a small degree of rotation of the gear F which in turn is translated into a small degree of rotation of the tuning element control shaft B for the fine tuning purposes. Means generally designated H operatively connects the detent element B with a display means generally designated I, which display means I is designed to exhibit in digital or other form an identification of the particular channel to which the set is tuned at any particular moment.

The tuner element as thus far described are, broadly considered individually and in combination, not novel. They are to be found in many prior art tuning arrangements. What favorably and inventively characterizes the tuning arrangement here disclosed from those of the prior art is the manner in which these elements are constructed and arranged and interact to produce a smaller, more compact, simpler assembly which in nevertheless exceedingly sturdy and reliable and easy to operate. This will become apparent from the detailed description which follows.

Figure 2:
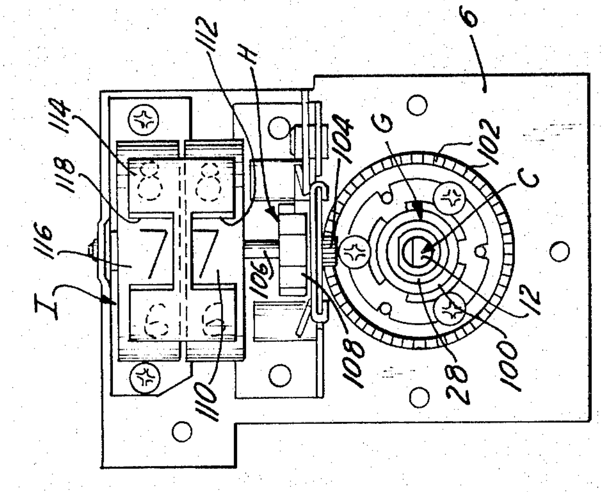
FIG. 2 is an end elevational view thereof taken from the right hand end of FIG. 1.
Figure 1:
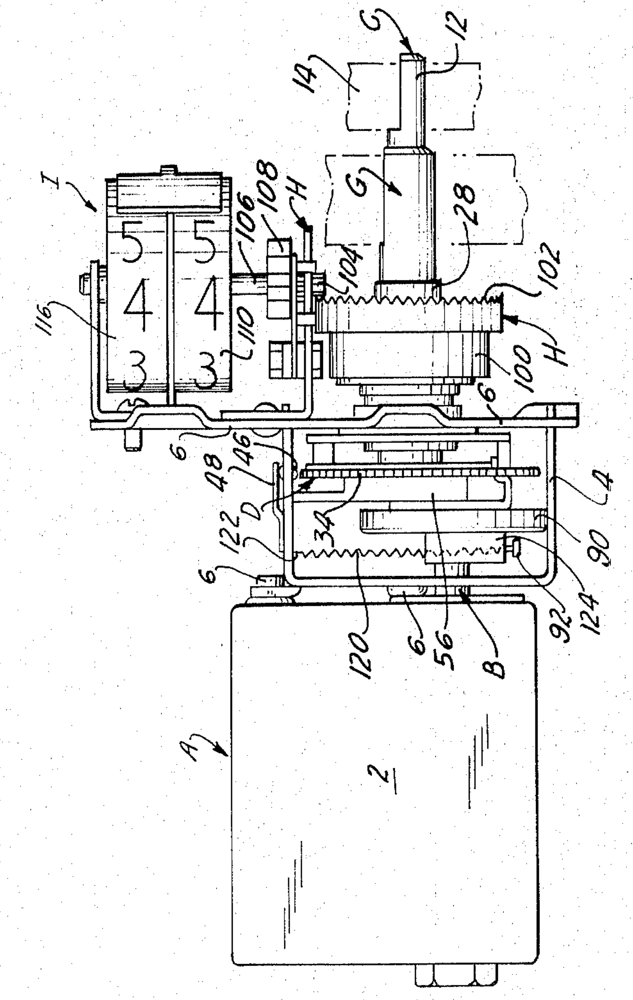
FIG. 1 is a front elevational view of an exemplary embodiment of the present invention.

The tuning element A comprises a casing 2 within which the various tunable electrical or electro-mechanical elements are contained, and from which the control shaft B extends. The tuning arrangement of the present invention is mounted on a generally U-shaped frame 4 adapted to be secured to the casing 2 of the tuning element A in any suitable manner, as by means of screws 6. The legs of the frame 4 carry at their outer ends a mounting plate 7. The frame 4 is provided, closely adjacent the tuning element casing 2, with an opening 8 within which the reduced width tip 10 of the tuning shaft C is received, that shaft having an outer end 12 on which a knob 14 (shown in broken lines in FIG. 1) is adapted to be mounted, a main portion 16 and an intermediate width portion 18, a pinion 20 being mounted fast on the shaft C where the portions 16 and 18 of that shaft meet. The mounting plate 7 is provided with an opening 22 through which the portion 16 of the tuning shaft C passes and within which it is journaled, so that shaft C is rotatably supported in the frame.

The fine tuning shaft G is coaxially and rotatably mounted on the tuning shaft C, the inner end of the fine tuning shaft G being internally enlarged at 24, a bushing insert 26 being received in that enlarged opening 24 so as to be interposed between the shafts C and G. A sleeve 28 is freely rotatably received over the fine tuning shaft G, with a washer 30 interposed between the inner end of the sleeve 28 and the radial enlargement 32 at the inner end of the fine tuning shaft G. The sleeve 28 fits reasonably snugly but rotatably within the opening 22 in the support plate 6, that opening 22 thus journaling the sleeve 28, the fine tuning shaft G and the main tuning shaft C with respect to the support structure.

The rotary detent element D comprises a ring or disc 34 the periphery of which is provided with a plurality of notches or detent openings 36. When the tuner is to be used for UHF tuning 70 such notches 36 will be provided in the periphery of the ring or disc 34. Rigidly secured to the ring or disc 34 by means of projections 38 secure within recesses 39 is a detent element suporting part generally designated 40 provided with an elongated tubular axial extension 42, the latter being freely rotatably mounted on and supported by the portion 18 of the tuning shaft C over a very substantial component of the length thereof. The supporting part 40 will rotate with the ring or disc 34 and the elongated axial extension 42 will provide a reliable and strong journaling support for the detent element assembly D. To produce detent action, one of the arms of the frame 4 is provided with an opening 44 within which a detent ball 46 is received, a leaf spring 48 mounted on the support frame 4 engaging the ball 46 and resiliently urging it toward and into the indentations 36 in the periphery of the detent element 34.

Figure 3:
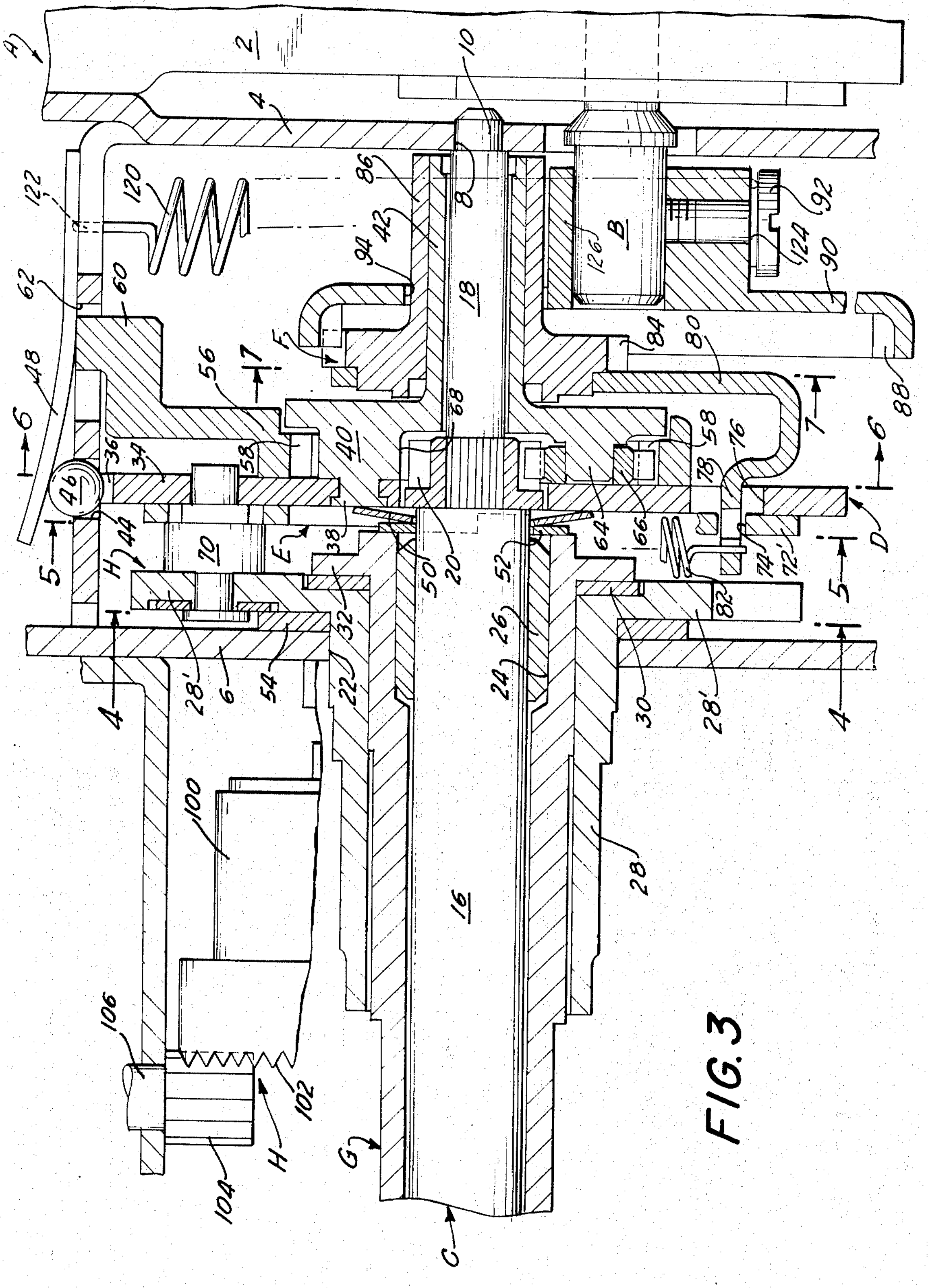
FIG. 3 is a fragmentary cross-sectional view, on an enlarged scale, of the tuner system.
Figure 4:
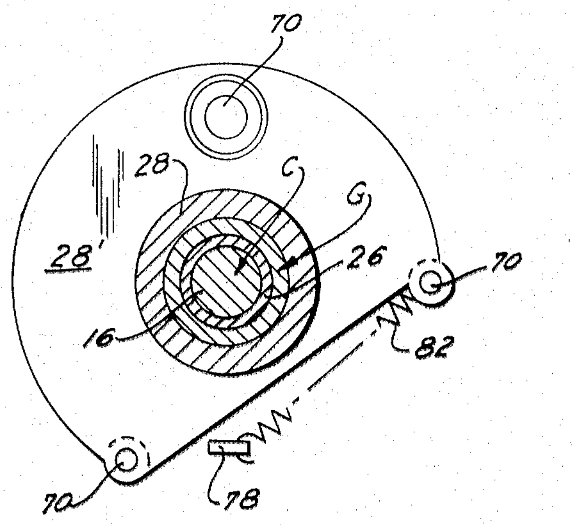
FIG. 4 is a cross-sectional view taken along the line 4—4 of FIG. 3.
Figure 5:
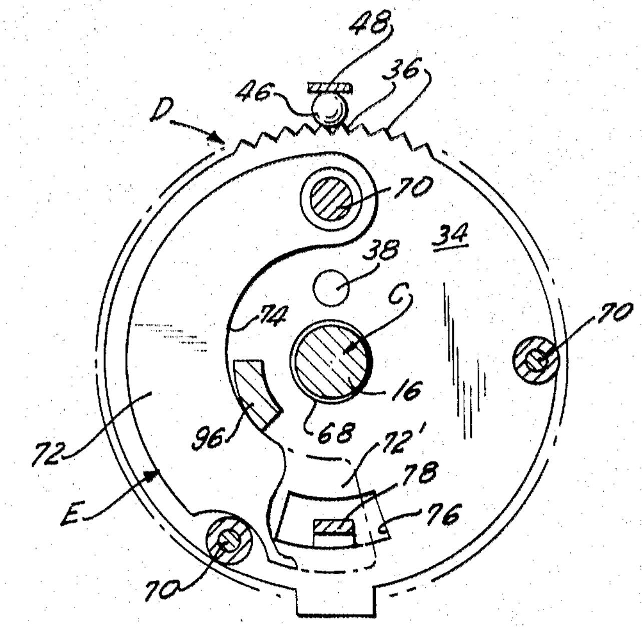
FIG. 5 is a cross-sectional view taken along the line 5—5 of FIG. 3.
Figure 6:
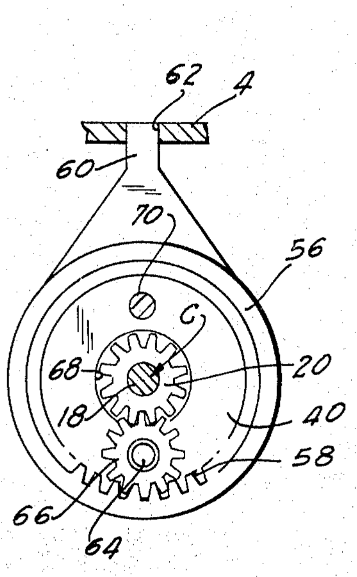
FIG. 6 is a cross-sectional view taken along the line 6—6 of FIG. 3.
Figure 7:
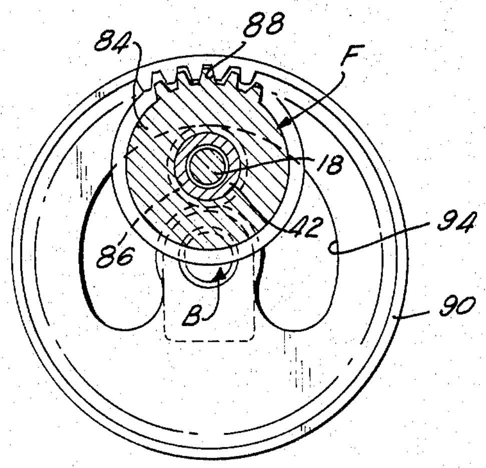
FIG. 7 is a cross-sectional view taken along the line 7—7 of FIG. 3.

The axial position of the detent element D, and the axial positions of the fine tuning shaft G and the sleeve 28, are achieved by means of the spring washer 50 and the washer 52, the spring washer 50 being retained in stressed condition between the left hand face of the detent ring or disc 34 and the right hand face of the fine tuning shaft G (all directions are specified as viewed in FIG. 3), the radially enlarged portion 32 of the fine tuning shaft G in turn fixing the axial position of the sleeve 28. A washer 54 may be interposed between the left hand face of the radially enlarged portion 28' of the sleeve 28 and the right hand face of the support part 6.

Rotatably mounted on the support part 40 of the detent element D is a ring gear 56 having internal gear teeth 58. Extending upwardly from the ring gear 56 is an extension 60 received within an opening 62 in the frame 4, thereby holding the ring gear 56 stationary against rotation. Carried by the detent element support part 40, on stud 64, is a planetary gear 66 which is rotatable relative to the stud 64, which meshes with the internal gear teeth 58 of the ring gear 56, and which likewise meshes with the pinion 20 fast on the tuning shaft C. The detent element supporting part 40 is recessed, at 68, to receive the tuning-shaft-carried pinion 20 and also to receive at least a part of the planetary gear 66, this making for a much more axially compact structure than would otherwise be the case.

Studs 70 connect the detent element ring or disc 34 with the radially outwardly extending portions 28' of the sleeve 28, so that the sleeve 28 and the detent element D rotate together. The ring gear 56 and the planetary gear 66 are located closely adjacent the right hand face of the detent element ring or wheel 34. Mounted on the left hand face thereof so as to be pivotable about stud 70 is an arm 72 having an arcuate inner surface 74 which is non-concentric with the axis about which the detent element D rotates. The free end 72' of the arm 72 is provided with an opening 74 in line with a larger opening 76 in the ring or disc 34, and the finger 78 of another arm 80 extends through the openings 76 and 74, a spring 82 being tensioned between the tip of the finger 78 and a remote point on the ring or disc 34, such as one of the studs 70 which connect that ring or disc to the flanged portion 28' of the sleeve 28, to cause the finger 78 to be biased into engagement with the arm 72 at the opening 74. The arm 80, which is located to the right hand side of the detent element D, is made fast to a gear 84 so as to drive the latter in rotation, that gear 84 being rotatably mounted on the extension 42 of the detent element supporting part 40 and itself preferably having an elongated axial extension 86 so as to give to it the optimum degree of firm support without inhibiting rotation. The gear 84 meshes with internal teeth 88 on a gear 90 which is made fast on the tuning element control shaft B, as by means of set screw 92. The gear 90 is provided with an elongated arcuate slot 94 through which the portion 18 of the tuning shaft C and the extensions 42 and 86 of the detent element support 40 and the gear 84 respectively extends.

Mounted on the right hand end (as viewed in FIG. 3) of the fine tuning shaft G is an axially extending cam protrusion 96 so radially located relative to the axis of rotation of the fine tuning shaft G and the inner surface 74 of the arm 72 carried by the detent element ring or disc 34 as to engage that surface 74, the spring 82 acting on the arm 72 so as to maintain the arm surface 74 in engagement with the cam protrusion 96. The degree to which the arm 72 will be pivoted about the stud 70 relative to the detent element can or disc 34 by the axial cam protrusion 96 will be determined by the rotative position of the latter.

As the detent element D rotates the arm 72 carried thereby will rotate with it and to the same extent, thus producing a corresponding degree of rotation in the gear 84, thus producing a corresponding rotation of the control shaft B of the tuning element A. That is what takes place during coarse tuning from one channel to another. When the arm 72 is moved relative to the detent element ring or disc 34 while the latter remains stationary , a corresponding movement will be imparted to the gear 84 via the arm 80, and hence a corresponding movement will be imparted to the control shaft B of the tuning element A. That is what takes place during fine tuning.

The sleeve 28 is used to actuate any suitable display mechanism, such as the digital display mechanism I. As here disclosed a cylinder 100 is secured to the sleeve 28 to rotate therewith and is provided with axially extending gear teeth 102 which mesh with pinion 104 mounted on the support extension 106. The pinion 104 in turn rotates shaft 106, on which a separate detent wheel 108 may be mounted if desired, the shaft 106 rotating a "units" wheel 110 the appropriate indicia of which are made visible through window 112 in mask 114. Appropriate internal mechanism will cause the "tens" wheel 116 to rotate one step for each complete rotation of the units "units" wheel 110, thereby successively to bring the "tens" indicia into view through window 118 of the mask 114.

For best results, the driving structure of the tuner in the present invention should be biased in one direction in order to eliminate backlash and provide for accurate operation. To that end, a tension spring 120 may have one end 122 fixed to the support frame 4 and have its other end 124 wrapped around the hub 126 of the gear 90 and secured thereto, as by means of the screw 92, the spring 120 thus biasing the gear 90 in a given rotative direction and, through the gear 84, the arm 80, the arm 72 and the detent element D , the planetary gear 66 and the pinion 20, biasing all of the other rotative portions of the driving system in corresponding rotative directions.

One feature of the arrangement of the present invention which is exceptionally advantageous from a manufacturing and repair point of view is that the tuning shafts C and G, the sleeve 28, the detent element D, the ring gear 56 with its extension 60, the arm 80 and its attached gear 84, all constitute one compact, unitary subassembly, manufacturable and handleable as such. To assemble it with the tuning element A to which the support frame 4 has been secured, and after the gear 90 and the spring 120 have been put in place, all that need be done is to move that sub-assembly into position, inserting the reduced width tip 10 of the shaft C into the opening 8 and the extension 60 of the ring gear 56 into the opening 62. The sub-assembly will be held in position by the mounting plate 7 when the latter is assembled with the frame 4.

Thus both initial assembly and repair are greatly facilitated. Moreover, the parts which make up the operating sub-assembly thus described are not only themselves individually sturdy and exceptionally reliably supported for freedom of movement without distortion, but, by reason of their inter-relation and inter-nesting they mutually support one another, thereby adding significant elements of strength and reliability, while at the same time reducing size and weight.

While but a single embodiment of the present invention has been here specifically disclosed, it will be apparent that many variations may be made therein, it will be apparent that many variations may be made therein, all within the scope of the invention as defined in the following claims.

I claim:

1. In a tuner, a frame, a tuning shaft mounted thereon, a tuning element mounted thereon, and having a control shaft, a rotary detent element having an axial extension, said extension being rotatably mounted on said frame, a gear rotatably mounted on said extension, a driving connection between said detent element and said gear, a driving connection between said gear and said control shaft, and a driving connection between said tuning shaft and said detent element.

2. The tuner of claim 1, in which said driving connection between said tuning shaft and said detent element comprises a planetary gear system.

3. The tuner of claim 1, in which said driving connection between said tuning shaft and said detent element comprises a planetary gear system comprising a central pinion on said tuning shaft, a fixed outer gear surrounding and radially spaced from said pinion, and a planetary gear mounted on said detent element and meshing with said pinion and said fixed gear.

4. The tuner of claim 3, in which said detent element is centrally recessed and said pinion and at least part of said planetary gear is received in said recess.

5. The tuner of claim 1, in which said driving connection between said gear and said control shaft comprises a second gear operatively drivingly connected to said first mentioned gear, rotatable about an axis radially displaced from the axis of rotation of said first gear, and provided with an arcuate slot, said extension of said rotary detent element extending through said slot.

6. The tuner of claim 5, in which said driving connection between said tuning shaft and said detent element comprises a planetary gear system comprising a central pinion on said tuning shaft, a fixed outer gear surrounding and radially spaced from said pinion, and a planetary gear mounted on said detent element and meshing with said pinion and said fixed gear, said detent being centrally recessed and said pinion and at least part of said planetary gear being received in said recess.

7. The tuner of claim 5, in which said first mentioned gear is provided with an axial extension rotatably journaled on said detent element extension.

8. The tuner of claim 7, in which said driving connection between said tuning shaft and said detent element comprises a planetary gear system comprising a central pinion on said tuning shaft, a fixed outer gear surrounding and radially spaced from said pinion, and a planetary gear mounted on said detent element and meshing with said pinion and said fixed gear, said detent element being centrally recessed and said pinion and at least part of said planetary gear being received in said recess.

9. The tuner of claim 7, in which said extension of said first mentioned gear passes through said arcuate slot in said second gear.

10. The tuner of claim 9, in which said driving connection between said tuning shaft and said detent element comprises a planetary gear system comprising a central pinion on said tuning shaft, a fixed outer gear surrounding and radially spaced from said pinion, and a planetary gear mounted on said detent element and meshing with said pinion and said fixed gear, said detent element being centrally recessed and said pinion and at least part of said planetary gear being received in said recess.

11. The tuner of claim 1, in which said gear is provided with an axial extension rotatably journaled on said detent element extension.

12. The tuner of claim 11, in which said driving connection between said tuning shaft and said detent element comprises a planetary gear system comprising a central pinion on said tuning shaft, a fixed outer gear surrounding and radially spaced from said pinion, and a planetary gear mounted on said detent element and meshing with said pinion and said fixed gear, said detent element being centrally recessed and said pinion and at least part of said planetary gear being received in said recess.

13. The tuner of claim 1, in which said detent element extension is rotatably mounted on said tuning shaft.

14. The tuner of claim 13, in which said driving connection between said tuning shaft and said detent element comprises a planetary gear system comprising a central pinion on said tuning shaft, a fixed outer gear surrounding and radially spaced from said pinion, and a planetary gear mounted on said detent element and meshing with said pinion and said fixed gear, said detent element being centrally recessed and said pinion and at least part of said planetary gear being received in said recess.

15. The tuner of claim 13, in which said gear is provided with an axial extension rotatably journaled on said detent element extension.

16. The tuner of claim 13, in which said driving connection between said gear and said control shaft comprises a second gear operatively drivingly connected to said first mentioned gear, rotatable about an axis radially displaced from the axis of rotation of said first gear, and provided with an arcuate slot, said extension of said rotary detent element extending through said slot.

17. The tuner of claim 16, in which said first mentioned gear is provided with an axial extension rotatably journaled on said detent element extension.

18. The tuner of claim 17, in which said extension of said first mentioned gear passes through said arcuate slot in said second gear.

19. The tuner of claim 1, in which said gear is located opposite one side face of said detent element, said driving connection between said detent element and said gear comprises a member articulately mounted on the other side face of said detent element and having a part drivingly connected to said gear, a fine tuning operator is mounted on said frame, a fine tuning element is operatively connected to said fine tuning operator to be rotated thereby about an axis, said fine tuning element being located opposite said other side face of said detent element and having cam means extending axially therefrom toward and engaging said member on said detent element and effective to move said member relative to said detent element as said fine tuning operator is moved, and said fine tuning element is rotated thereby.

* * * * *